(12) United States Patent
Sugahara

(10) Patent No.: US 9,705,462 B2
(45) Date of Patent: Jul. 11, 2017

(54) SENSOR SIGNAL OUTPUT CIRCUIT AND METHOD FOR ADJUSTING IT

(71) Applicant: FUJI ELECTRIC CO., LTD., Kawasaki-shi (JP)

(72) Inventor: Satoshi Sugahara, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 449 days.

(21) Appl. No.: 14/455,080

(22) Filed: Aug. 8, 2014

(65) Prior Publication Data

US 2015/0092819 A1 Apr. 2, 2015

(30) Foreign Application Priority Data

Sep. 30, 2013 (JP) ................................. 2013-203847

(51) Int. Cl.
  *G01K 7/01* (2006.01)
  *H03G 3/30* (2006.01)
  *H03F 3/45* (2006.01)

(52) U.S. Cl.
  CPC ................ *H03G 3/30* (2013.01); *G01K 7/01* (2013.01); *H03F 3/45475* (2013.01); *H03F 3/45968* (2013.01); *H03G 3/3005* (2013.01); *H03G 3/3021* (2013.01); *H03F 2200/261* (2013.01); *H03F 2200/411* (2013.01); *H03F 2200/78* (2013.01); *H03F 2203/45522* (2013.01); *H03F 2203/45528* (2013.01); *H03F 2203/45591* (2013.01); *H03F 2203/45594* (2013.01)

(58) Field of Classification Search
  CPC .................................................. G01K 15/005

USPC .......................................................... 374/170
See application file for complete search history.

(56) References Cited

U.S. PATENT DOCUMENTS

| 6,249,753 | B1 * | 6/2001 | Mason | G01D 3/022 340/501 |
| 7,731,417 | B2 * | 6/2010 | Kumagai | G01K 7/01 374/1 |
| 8,629,667 | B2 * | 1/2014 | Paillet | H03K 7/08 323/282 |
| 2005/0099163 | A1 * | 5/2005 | Liepold | G01K 17/06 320/150 |
| 2015/0092819 | A1 * | 4/2015 | Sugahara | H03F 3/45475 374/178 |

FOREIGN PATENT DOCUMENTS

JP 2008005217 A * 1/2008

* cited by examiner

*Primary Examiner* — Minh Phan
*Assistant Examiner* — Leon W Rhodes, Jr.
(74) *Attorney, Agent, or Firm* — Rabin & Berdo, P.C.

(57) ABSTRACT

A sensor signal output circuit includes: a buffer amplifier which amplifies an output of a temperature sensor; an operational amplifier which amplifies an output of the buffer amplifier; an oscillator which generates a triangular wave signal; and a comparator which compares the triangular wave signal with an output of the operational amplifier to generate a PWM signal. After an offset adjusting resistor of the operational amplifier is adjusted at first temperature, the amplitude of the triangular wave signal is set to adjust the pulse width of the PWM signal at the first temperature. After that, a gain adjusting resistor of the operational amplifier is set to adjust the pulse width of the PWM signal at a second temperature.

9 Claims, 7 Drawing Sheets

SENSOR SIGNAL OUTPUT CIRCUIT AND METHOD FOR ADJUSTING IT

BACKGROUND OF THE INVENTION

1. Field of the Invention

The present invention relates to a sensor signal output circuit and a method for adjusting the sensor signal output circuit, which are suitable, for example, for outputting an output signal of a temperature sensor to the outside with good linearity to temperature.

2. Description of the Background Art

In an electronic circuit apparatus using a heat generating device such as an IGBT or a power MOS-FET, the temperature of the heat generating device or its ambient environment is monitored by use of a temperature sensor. On this occasion, an output voltage of the sensor having a linear output characteristic with respect to temperature change, such as a temperature detecting diode, is converted into a PWM signal with a pulse width corresponding to the output voltage, and outputted to the outside for informing a monitoring circuit etc.

FIG. 3 shows an example of a typical configuration of such a sensor signal output circuit 1 in the background art. In the sensor signal output circuit 1, a voltage Vf generated in a temperature detecting diode 3 driven by a constant current source 2 is amplified by an operational amplifier 4. In the sensor signal output circuit 1, a triangular wave signal with a predetermined amplitude outputted by an oscillator 5 is compared with an output voltage of the operational amplifier 4 by a comparator 6 so as to generate a PWM signal with a pulse width corresponding to the output voltage. The sensor signal output circuit 1 is configured to output the PWM signal to the outside through a buffer amplifier 7.

Incidentally, as shown in FIG. 4, the operational amplifier 4 has an inverting input terminal to which an analog input signal V1 is inputted through an input resistor R1, and a non-inverting input terminal to which a reference voltage V2 divided by an input resistor R2 and a ground resistor R4 is inputted. In addition, a feedback resistor R3 is provided between the inverting input terminal and an output terminal of the operational amplifier 4. The operational amplifier 4 which constructs a differential amplifier circuit in this manner obtains an output voltage Vout as:

$$V\text{out}=(V2-V1)R3/R1$$

which is fundamentally conditioned on [R1=R2] and [R3=R4].

Although the output voltage Vf of the temperature detecting diode 3 is linear with respect to the change of a temperature T, the output characteristic of the temperature detecting diode 3 contains a variation unique to the device. For this reason, the pulse width of the PWM signal may be displaced from a pulse width predetermined with respect to the temperature T, for example, as shown in FIG. 5A. Incidentally, in FIGS. 5A to 5C, the solid line A designates an output characteristic before correction and the broken line B designates a target output characteristic. The displacement of the pulse width of the PWM signal with respect to the temperature, that is, the displacement of the output characteristic is corrected in such a manner that an offset voltage and a gain of the operational amplifier 4 are adjusted to correct the output voltage of the operational amplifier 4, for example, as disclosed in JP-A-2008-5217.

The offset voltage of the operational amplifier 4 can be adjusted by changing the reference voltage V2 or by changing the ratio between the input resistor R2 and the ground resistor R4. In addition, the gain of the operational amplifier 4 can be adjusted by changing the ratio between the input resistor R1 and the feedback resistor R3. Specifically, first, as shown in FIG. 5B, the offset voltage of the operational amplifier 4 is adjusted in focus on a pulse width D1 of the PWM signal in a first temperature T1, so as to correct the output characteristic as designated by the solid line C. Then, as shown in FIG. 5C, the gain of the operational amplifier 4 is adjusted in focus on a pulse width D2 of the PWM signal in a second temperature T2 different from the first temperature T1, so as to correct the output characteristic as designated by the solid line D.

However, as described above, when the gain of the operational amplifier 4 is adjusted after the offset voltage of the operational amplifier 4 is adjusted, there is a problem that another new displacement appears in the pulse width D1 of the PWM signal in the first temperature T1, for example, as shown in FIG. 5C. That is, since the adjustment of the offset voltage and the adjustment of the gain on the operational amplifier 4 are performed separately from each other under independent parameters, it cannot be denied that the corrections of the output characteristic in the first and second temperatures T1 and T2 affect each other. Therefore, it is necessary to perform the adjustment of the offset voltage and the adjustment of the gain alternately and repeatedly in order to correct the output characteristic of the sensor signal output circuit 1 to the predetermined target output characteristic B.

SUMMARY OF THE INVENTION

The invention has been accomplished in consideration of such circumstances. An object of the invention is to provide a sensor signal output circuit and a method for adjusting the sensor signal output circuit, by which an output signal of a sensor, for example, consisting of a temperature detecting diode can be outputted to the outside with good linearity under simple adjustment.

In order to achieve the aforementioned object, according to the invention, there is provided a sensor signal output circuit having:

a buffer amplifier which amplifies and outputs an output signal of a temperature sensor;

an operational amplifier which has an inverting input terminal, a non-inverting input terminal and an output terminal, an output voltage of the buffer amplifier being inputted to the inverting input terminal through a resistor, a reference voltage divided by an offset adjusting resistor being inputted to the non-inverting input terminal, a gain adjusting resistor being provided between the inverting input terminal and the output terminal;

an oscillator which generates a triangular wave signal with a predetermined amplitude;

a comparator which compares the triangular wave signal with an output voltage of the operational amplifier and generates a PWM signal with a pulse width corresponding to the output voltage;

an offset adjusting unit which adjusts the offset adjusting resistor to make the output voltage of the buffer amplifier in a first temperature equivalent to the voltage of the inverting input terminal of the operational amplifier;

an amplitude adjusting unit which adjusts the amplitude of the triangular wave signal to make the pulse width of the PWM signal equivalent to a defined first pulse width in the first temperature under the condition that the offset adjusting resistor has been set; and a gain adjusting unit which adjusts the gain adjusting resistor to make the pulse width of the PWM signal equivalent to a defined second pulse width in a second temperature different from the first temperature under the condition that the amplitude of the triangular wave signal has been set.

Incidentally, the temperature sensor consists of a temperature detecting diode which has a linear output characteristic with respect to temperature change. The offset adjusting unit adjusts the offset adjusting resistor to make an offset voltage applied to the non-inverting input terminal of the operational amplifier equivalent to the output voltage of the buffer amplifier in the first temperature.

In addition, according to the invention, there is provided a method for adjusting a sensor signal output circuit, wherein: in the sensor signal output circuit having the aforementioned configuration, the method includes the steps of:

first setting the offset adjusting resistor to make the output voltage of the buffer amplifier in a first temperature equivalent to the voltage of the inverting input terminal of the operational amplifier;

then setting the amplitude of the triangular wave signal to make the pulse width of the PWM signal equivalent to a predefined first pulse width in the first temperature; and then setting the gain adjusting resistor to make the pulse width of the PWM signal in a second temperature different from the first temperature equivalent to a predefined second pulse width in the second temperature.

Preferably, the amplitude of the triangular wave signal generated by the oscillator may be set in advance as a value close to a predetermined target amplitude so that the gain adjusting resistor can be set in the second temperature after the offset adjusting resistor is set in the first temperature.

According to the sensor signal output circuit having the aforementioned configuration and the method for adjusting the sensor signal output circuit, the offset adjusting resistor is adjusted to make the output voltage of the buffer amplifier in the first temperature T1 equivalent to the voltage of the inverting input terminal of the operational amplifier. Under this setting condition, the amplitude of the triangular wave signal is then adjusted to make the pulse width of the PWM signal equivalent to the predefined first pulse width in the first temperature. In addition thereto, the gain adjusting resistor is adjusted to make the pulse width of the PWM signal in the second temperature equivalent to the predefined second pulse width in the second temperature. Accordingly, the inclination of the output characteristic indicating the gain of the operational amplifier varies with reference to the first pulse width in the first temperature T1.

Consequently, according to the invention, when the offset adjusting resistor, the amplitude of the triangular wave signal, and the gain adjusting resistor are merely adjusted in the named order, the output characteristic of the sensor signal output circuit can be set simply so that the sensor signal output circuit can output a PWM signal with a predefined pulse width. Accordingly, it is not necessary to repeat the adjustment of the offset and the adjustment of the gain on the operational amplifier as in the background-art sensor signal output circuit. Therefore, the PWM signal with the pulse width indicating the output voltage of the temperature sensor can be obtained simply with good linearity. Thus, the practical advantage of the invention is significant.

DETAILED DESCRIPTION OF THE INVENTION

A sensor signal output circuit and a method for adjusting the sensor signal output circuit according to the invention will be described below with reference to the drawings.

Figure 1:
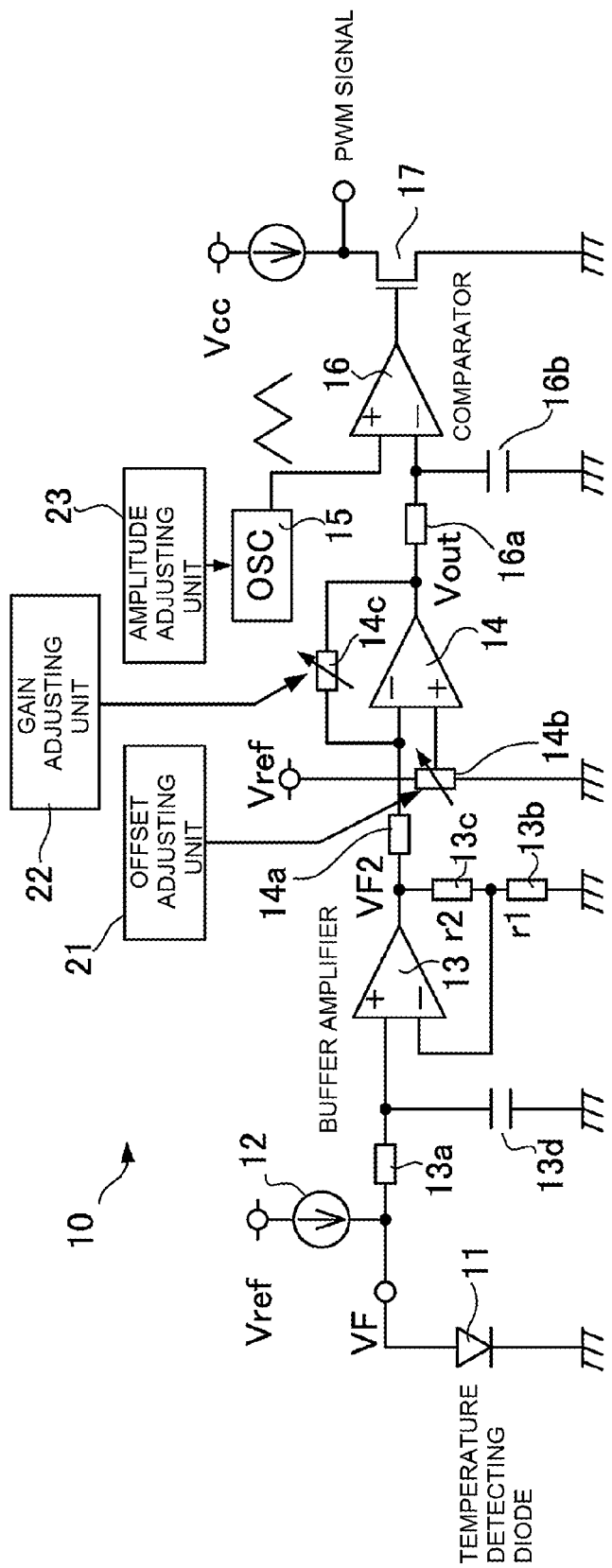
FIG. 1 is a schematic configuration view of a main part of a sensor signal output circuit according to an embodiment of the invention.

FIG. 1 is a schematic configuration view of a main part of a sensor signal output circuit 10 according to an embodiment of the invention. The sensor signal output circuit 10 receives an output voltage VF of a temperature detecting diode 11 embedded in a heat generating device such as an IGBT, generates a PWM signal with a pulse width corresponding to the output voltage VF, and outputs the generated PWM signal to the outside. The temperature detecting diode 11 has a linear output characteristic with respect to the change of a temperature T. The temperature detecting diode 11 is driven by a constant current source 12 to generate the output voltage VF in accordance with the temperature T.

The sensor signal output circuit 10 is provided with a buffer amplifier 13 which receives and amplifies the output voltage VF of the temperature detecting diode 11, and an operational amplifier 14 which amplifies an output voltage VF2 of the buffer amplifier 13. Further, the sensor signal output circuit 10 is provided with a comparator 16 which compares a triangular wave signal generated by an oscillator 15 with an output voltage Vout of the operational amplifier 14, and generates a PWM signal with a pulse width corresponding to the output voltage Vout. The PWM signal generated by the comparator 16 is outputted to the outside through an output circuit consisting of an MOS-FET 17.

The buffer amplifier 13 consists of an inverting type amplifier circuit having a non-inverting input terminal, an inverting input terminal and an output terminal. The output voltage VF of the temperature detecting diode 11 is inputted to the non-inverting input terminal through a resistor 13a. The inverting input terminal is grounded through a resistor 13b. A feedback resistor 13c is connected between the output terminal and the inverting input terminal. Incidentally, the non-inverting input terminal of the buffer amplifier 13 is grounded through a capacitor 13d. A noise component contained in the output voltage VF of the temperature detecting diode 11 is eliminated by the capacitor 13d.

Incidentally, an amplification factor of the buffer amplifier 13 is defined by a value r1 of the resistor 13b and a value r2 of the resistor 13c. For the output voltage VF of the temperature detecting diode 11, the buffer amplifier 13 obtains an output voltage VF2 expressed as:

$$VF2 = VF \cdot (r1 + r2)/r1$$

On the other hand, the output voltage VF2 of the buffer amplifier 13 is inputted through a resistor 14a to an inverting input terminal of the operational amplifier 14. An offset voltage derived from a reference voltage Vref divided by an offset adjusting resistor 14b is inputted to a non-inverting input terminal of the operational amplifier 14. Further, a gain adjusting resistor 14c is provided between the inverting input terminal and an output terminal of the operational amplifier 14. In this manner, the operational amplifier 14 constructs an inverting type amplifier circuit.

For example, the offset adjusting resistor 14b consists of a variable resistor provided with an intermediate terminal which divides and outputs the reference voltage Vref applied between a pair of terminals. The divided voltage of the reference voltage Vref by the intermediate terminal can be varied by an offset adjusting unit 21. Thus, the offset adjusting resistor 14b serves for adjusting the offset voltage applied to the non-inverting input terminal of the operational amplifier 14.

In addition, the gain adjusting resistor 14c consists of a variable resistor whose resistance value can be varied within a predetermined range. The resistance value can be set variably by a gain adjusting unit 22. Thus, the gain adjusting resistor 14c serves for adjusting a gain of the operational amplifier 14 defined by a ratio between the resistance value of the gain adjusting resistor 14c and the resistance value of the resistor 14a.

Incidentally, the output voltage Vout of the operational amplifier 14 is applied to an inverting input terminal of the comparator 16 through a resistor 16a. In addition, the inverting input terminal of the comparator 16 is grounded through a capacitor 16b. The output voltage Vout from which a noise component is eliminated by the capacitor 16b is inputted to the comparator 16. In addition, the oscillator 15 which inputs the triangular wave signal to a non-inverting input terminal of the comparator 16 is configured so that the amplitude of the triangular wave signal can be set variably by an amplitude adjusting unit 23.

The comparator 16 outputs an L level signal when the voltage of the triangular wave signal is lower than the output voltage Vout. The comparator 16 outputs an H level signal when the voltage of the triangular wave signal is higher than the output voltage Vout. In this manner, the comparator 16 generates a PWM signal with a pulse width corresponding to the output voltage Vout. The PWM signal generated by the comparator 16 is logically inverted and outputted to the outside through the MOS-FET 17.

The output characteristic of the sensor signal output circuit 10 configured in this manner is corrected as follows. Here assume that, in the specification requested for the sensor signal output circuit 10, the PWM signal with a pulse width D1 in a first temperature T1 is outputted to the outside from the sensor signal output circuit 10 and the PWM signal with a pulse width D2 in a second temperature T2 different from the first temperature T1 is outputted to the outside from the sensor signal output circuit 10, as expressed as an output characteristic B in FIG. 2A.

Figure 2A:
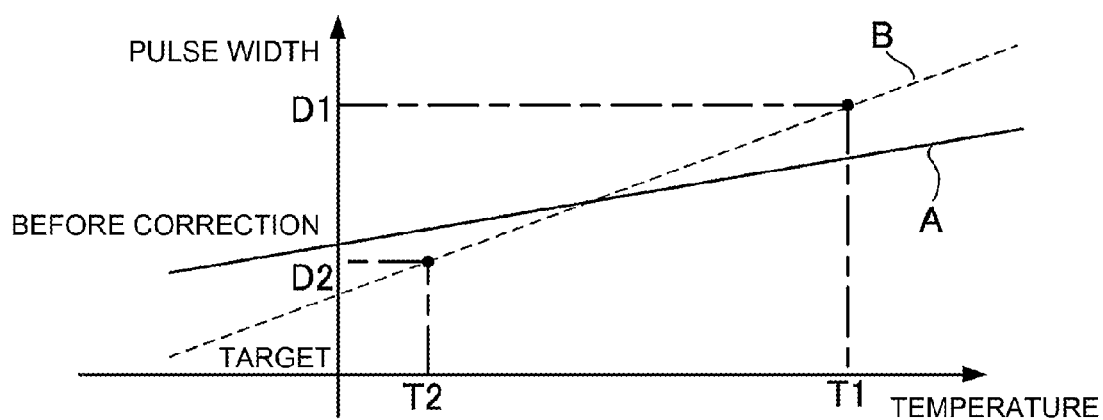
FIGS. 2A to 2C are views showing an adjustment procedure of an output characteristic in the sensor signal output circuit shown in FIG. 1.

In contrast with such an output characteristic B, assume that the output characteristic of the sensor signal output circuit 10 with respect to the output voltage VF of the temperature detecting diode 11 is given as expressed as an output characteristic A in FIG. 2A. The displacement between the output characteristics A and B is entirely caused by a variation in device characteristic due to the individuality of the temperature detecting diode 11.

Therefore, first, the offset voltage applied to the operational amplifier 14 is adjusted so that the output voltage VF2 of the buffer amplifier 13 in the first temperature T1 can be made equivalent to the voltage of the inverting input terminal of the operational amplifier 14. The offset voltage is adjusted in such a manner that the division ratio of the reference voltage Vref divided by the offset adjusting resistor 14b is adjusted under the offset adjusting unit 21 and the voltage of the non-inverting input terminal of the operational amplifier 14 is set as the output voltage VF2.

Then, the voltage of the inverting input terminal of the operational amplifier 14 becomes equivalent to the output voltage VF2 of the buffer amplifier 13 to prevent the current from flowing into the resistor 14a. In addition, at the same time, the output voltage Vout generated in the output terminal of the operational amplifier 14 becomes equivalent to the voltage applied to the inverting input terminal of the operational amplifier 14 to prevent the feedback current from flowing through the gain adjusting resistor 14c. The output voltage Vout is shifted by the offset voltage adjusted through the offset adjusting resistor 14b.

Figure 2B:
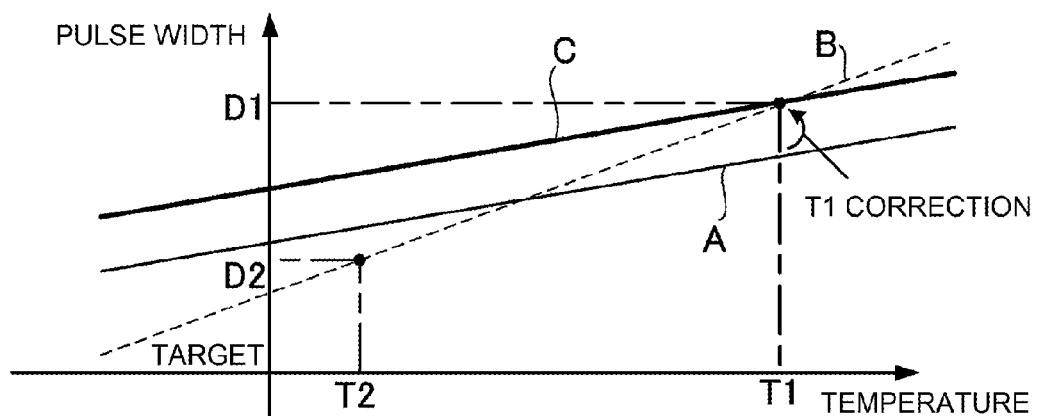

Next, the amplitude of the triangular wave signal is adjusted by use of the amplitude adjusting unit 23 under the offset condition set thus. Specifically, the amplitude of the triangular wave signal is adjusted so that the pulse width D of the PWM signal outputted from the comparator 16 can be made equivalent to the defined first pulse width D1 in the aforementioned first temperature T1. Due to the adjustment of the amplitude of the triangular wave signal and in combination with the adjustment of the offset, the output characteristic of the sensor signal output circuit 10 is shifted and offset-corrected as expressed as a characteristic C in FIG. 2B.

Here, what is important is that, according to the aforementioned correction condition, the PWM signal with the pulse width D1 has a temperature characteristic whose inclination is zero (0) in the first temperature T1, that is, the PWM signal with the pulse width D1 can be always obtained in the first temperature T1. Accordingly, even when the gain of the operational amplifier 14 is varied, there is no fear that the pulse width D1 of the PWM signal in the first temperature T1 varies. When the gain of the operational amplifier 14 is varied, the inclination of the output characteristic of the sensor signal output circuit 10 varies starting from the first temperature T1.

Figure 2C:
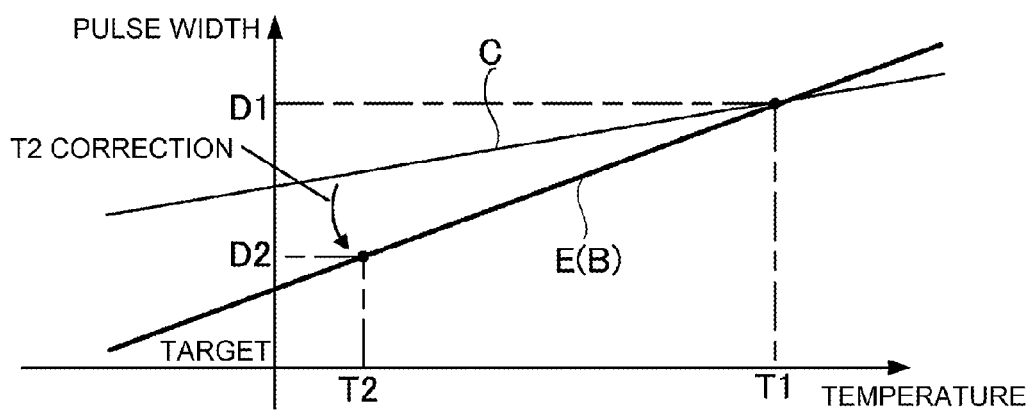
Figure 3:
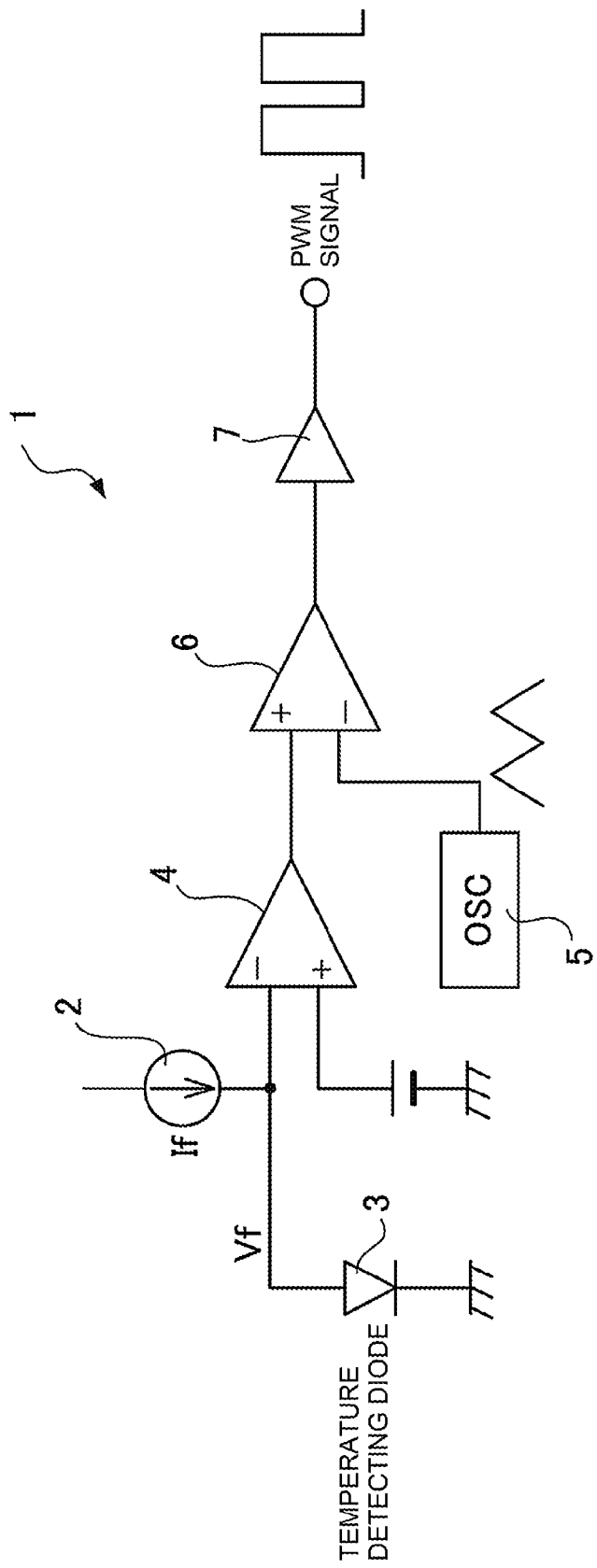
FIG. 3 is a schematic configuration view of a main part showing an example of a sensor signal output circuit according to the background art.
Figure 4:
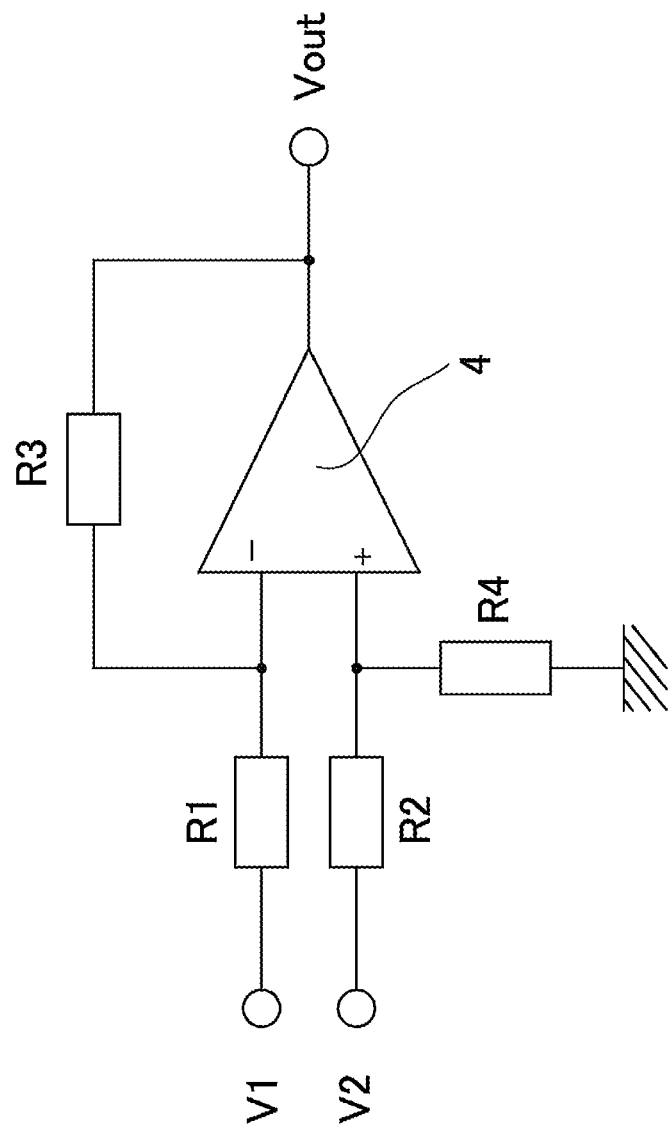
FIG. 4 is a view showing the configuration of a differential amplifier circuit using an operational amplifier.
Figure 5A:
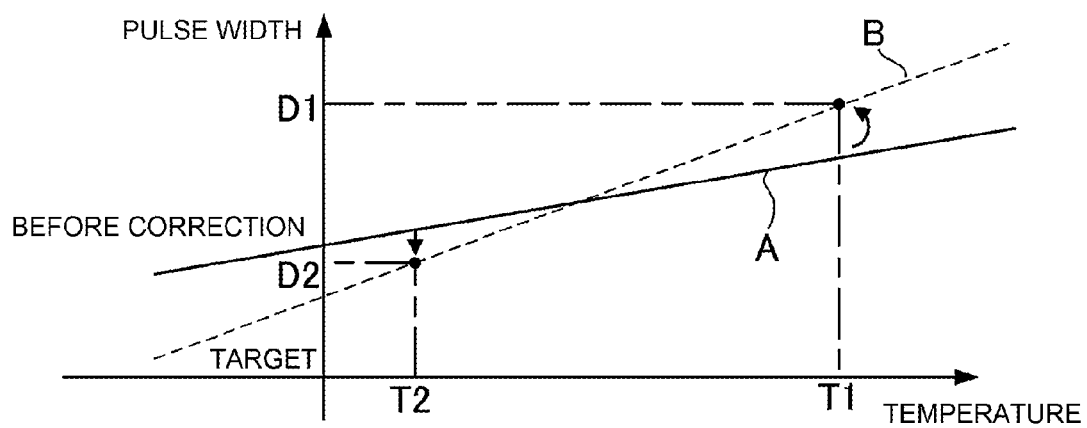
FIGS. 5A to 5C are views showing a general adjustment procedure of an output characteristic in the sensor signal output circuit shown in FIG. 3.
Figure 5B:
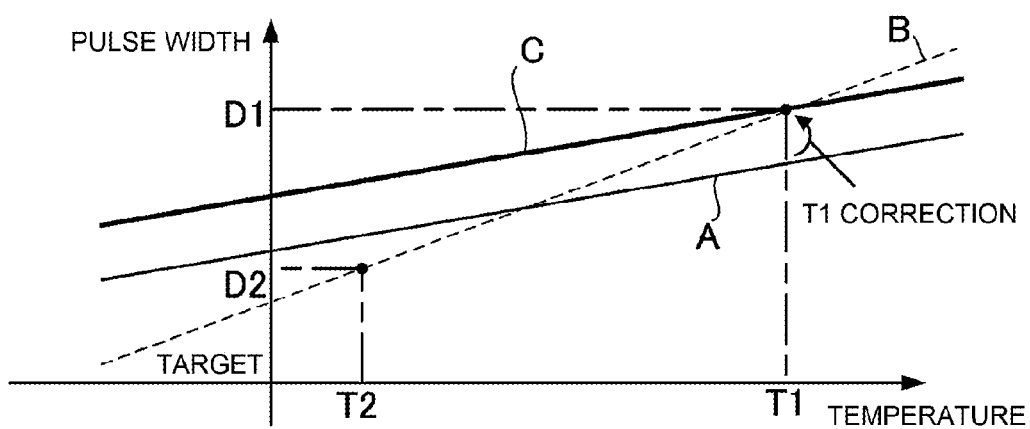
Figure 5C:
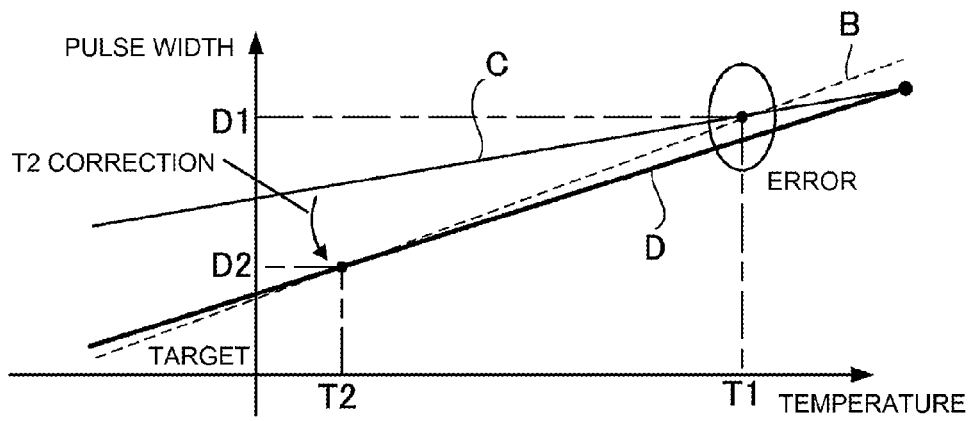

Therefore, under the aforementioned setting condition, the resistance value of the gain adjusting resistor 14c is then adjusted by use of the gain adjusting unit 22 to set the gain of the operational amplifier 14. The gain of the operational amplifier 14 is set in focus on the pulse width D of the PWM signal in the second temperature T2 different from the first temperature T1 so that the pulse width D can be made equivalent to the defined pulse width D2 in the second temperature T2. The inclination of the output characteristic of the sensor signal output circuit 10 is set starting from the first temperature T1 by the adjustment of the gain adjusting resistor 14c so that the pulse width D of the PWM signal can be set to be equivalent to the pulse width D2 in the second temperature T2 as expressed as a characteristic E in FIG. 2C.

As a result, the output characteristic of the sensor signal output circuit 10 is set so that the PWM signal with the pulse width D1 can be obtained in the first temperature T1 and the PWM signal with the pulse width D2 can be obtained in the second temperature T2. That is, the output characteristic of the sensor signal output circuit 10 is set to satisfy the specification requested for the sensor signal output circuit 10. Moreover, the output characteristic of the sensor signal output circuit 10 can be corrected simply by merely executing the aforementioned offset adjustment, the aforementioned amplitude adjustment, and the aforementioned gain adjustment in the named order under the first and second temperatures T1 and T2.

Particularly, according to the invention, the corrections on the output characteristic of the sensor signal output circuit 10 under the two temperature conditions can be executed independently of each other. That is, the offset adjustment and the gain adjustment on the operational amplifier 14 can be executed separately without affecting each other. Accordingly, it is not necessary to execute the offset adjustment and the gain adjustment repeatedly as in the background-art method for correcting the output characteristic. Accordingly, the practical advantage of the invention is significant.

Incidentally, the invention is not limited to the aforementioned embodiment. The aforementioned embodiment has been described in the case where after the offset is adjusted, the amplitude of the triangular wave signal is adjusted and then the gain is adjusted. However, when, for example, the amplitude of the triangular wave signal is fixed in advance to a value close to a target amplitude, the output characteristic of the sensor signal output circuit can be adjusted simply by merely executing the gain adjustment after the offset adjustment. Incidentally, for example, the target amplitude may be set so that the PWM signal in a predetermined temperature, specifically the first temperature can be made equivalent to a predetermined pulse width Dstd.

In addition, although description has been made here on the assumption that the first temperature T1 is higher than the second temperature T2, it is a matter of course that the relationship between the first and second temperatures T1 and T2 may be reversed. Further, it is preferable that the temperature difference between the first and second temperatures T1 and T2 is set to be as large as possible in accordance with the temperature range the temperature detecting diode 11 can detect. In addition, the embodiment has shown the case where the output voltage of the temperature detecting diode embedded in the IGBT is outputted as the PWM signal to the outside by way of example. However, the invention can be similarly applied to circuits from which output voltages of various temperature sensors having linear output characteristics with respect to temperature are outputted as PWM signals. In addition, the invention can be modified and carried out without departing from its spirit and scope.

What is claimed is:

1. A sensor signal output circuit for use with a temperature sensor, comprising:
   a buffer amplifier which amplifies and outputs an output signal of the temperature sensor;
   an operational amplifier which has an inverting input terminal, a non-inverting input terminal, and an output terminal, an output voltage of the buffer amplifier being inputted to the inverting input terminal through a resistor, a reference voltage divided by an offset adjusting resistor being inputted to the non-inverting input terminal, and a gain adjusting resistor being provided between the inverting input terminal and the output terminal;
   an oscillator which generates a triangular wave signal with a predetermined amplitude;
   a comparator which compares the triangular wave signal with an output voltage of the operational amplifier and generates a PWM signal with a pulse width corresponding to the output voltage of the operational amplifier;
   an offset adjusting unit which adjusts the offset adjusting resistor to make the output voltage of the buffer amplifier at a first temperature equivalent to the voltage at the inverting input terminal of the operational amplifier;
   an amplitude adjusting unit which adjusts the amplitude of the triangular wave signal to make the pulse width of the PWM signal equivalent to a defined first pulse width at the first temperature after the offset adjusting resistor has been set; and
   a gain adjusting unit which adjusts the gain adjusting resistor to make the pulse width of the PWM signal equivalent to a defined second pulse width at a second temperature that different from the first temperature after the amplitude of the triangular wave signal has been set.

2. A sensor signal output circuit according to claim 1, wherein the temperature sensor is a temperature detecting diode which has a linear output characteristic with respect to temperature change.

3. A sensor signal output circuit according to claim 1, wherein the offset adjusting unit adjusts the offset adjusting resistor to make an offset voltage applied to the non-inverting input terminal of the operational amplifier equivalent to the output voltage of the buffer amplifier at the first temperature.

4. A method for adjusting a sensor signal output circuit for use with a temperature sensor, the sensor signal output circuit including:
   a buffer amplifier which amplifies and outputs an output signal of a temperature sensor;
   an operational amplifier which has an inverting input terminal, a non-inverting input terminal, and an output terminal, an output voltage of the buffer amplifier being inputted to the inverting input terminal through a resistor, a reference voltage divided by an offset adjusting resistor being inputted to the non-inverting input terminal, and a gain adjusting resistor being provided between the inverting input terminal and the output terminal;
   an oscillator which generates a triangular wave signal with a predetermined amplitude; and
   a comparator which compares the triangular wave signal with an output voltage of the operational amplifier and generates a PWM signal with a pulse width corresponding to the output voltage of the operational amplifier,
   said method comprising the steps of:
   setting the offset adjusting resistor to make the output voltage of the buffer amplifier at a first temperature equivalent to the voltage of the inverting input terminal of the operational amplifier;
   then setting the amplitude of the triangular wave signal to make the pulse width of the PWM signal equivalent to a predefined first pulse width at the first temperature; and
   then setting the gain adjusting resistor to make the pulse width of the PWM signal at a second temperature that is different from the first temperature equivalent to a predefined second pulse width at the second temperature.

5. A method for adjusting a sensor signal output circuit according to claim 4, wherein the temperature sensor is a temperature detecting diode which has a linear output characteristic with respect to temperature change.

6. A method for adjusting a sensor signal output circuit according to claim 4, wherein the offset adjusting resistor is adjusted so that an offset voltage applied to the non-inverting input terminal of the operational amplifier is equivalent to the output voltage of the buffer amplifier at the first temperature.

7. A sensor signal output circuit for use with a temperature sensor, comprising:
   a buffer amplifier which amplifies and outputs an output signal of the temperature sensor, the buffer amplifier including an inverting input and non-inverting input, the non-inverting input configured to receive the output signal of the temperature sensor and connected to ground via a capacitor, and the inverting input connected to an output terminal of the buffer amplifier via a feedback resistor and connected to ground via a first resistor;

an operational amplifier which has an inverting input terminal, a non-inverting input terminal, and an output terminal, an output voltage of the buffer amplifier being inputted to the inverting input terminal through a second resistor, a reference voltage divided by an offset adjusting resistor being inputted to the non-inverting input terminal, and a gain adjusting resistor being provided between the inverting input terminal and the output terminal, wherein the offset adjusting resistor and the gain adjusting resistor are variable-resistance resistors;

an oscillator which generates a triangular wave signal with a predetermined amplitude which is set in advance as a value close to a target amplitude;

a comparator which compares the triangular wave signal with an output voltage of the operational amplifier and generates a PWM signal with a pulse width corresponding to the output voltage of the operational amplifier;

an offset adjusting unit which adjusts the offset adjusting resistor to make the output voltage of the buffer amplifier at a first temperature equivalent to the voltage of the inverting input terminal of the operational amplifier; and a gain adjusting unit which adjusts the gain adjusting resistor to make the pulse width of the PWM signal equivalent to a defined second pulse width at a second temperature that is different from the first temperature.

8. A sensor signal output circuit according to claim 7, wherein the target amplitude is determined so that the pulse width of the PWM signal at the first temperature is equivalent to a preset pulse width.

9. A method for adjusting a sensor signal output circuit for use with a temperature sensor, comprising:
  amplifying a signal output from the temperature sensor and supplying the amplified signal to a first input terminal of an operational amplifier;
  supplying an offset voltage to a second input terminal of the operational amplifier via a first variable resistor;
  supplying an output voltage of the operational amplifier to the first input terminal of the operational amplifier via a second variable resistor;
  supplying an output voltage of the operational amplifier to a first input terminal of a comparator;
  supplying a triangular wave signal to a second input terminal of the comparator to output a pulse width modulated (PWM) signal from the comparator;
  setting an amplitude of the triangular wave signal to be a previously obtained target amplitude;
  setting a value of the offset to make the offset voltage equivalent to an input voltage at the first input terminal of the operational amplifier, wherein the value of the offset voltage is adjusted by adjusting a resistance value of the first variable resistor; and
  setting a gain of the operational amplifier by adjusting a resistance of the second variable-resistance resistor to make the pulse width of the PWM signal equivalent to a predefined second pulse width based on the amplified signal corresponding to a second temperature sensed by the temperature sensor and different from the first temperature.

* * * * *